United States Patent [19]
Bartanen et al.

[11] Patent Number: 5,731,955
[45] Date of Patent: Mar. 24, 1998

[54] SPRING CLIP FOR ELECTRONICS ASSEMBLY

[75] Inventors: Jon Gordon Bartanen, Livonia; Michael John Luettgen, Bloomfield, both of Mich.

[73] Assignee: Ford Motor Company, Dearborn, Mich.

[21] Appl. No.: 595,459

[22] Filed: Feb. 5, 1996

[51] Int. Cl.$^6$ ........................................ H05K 7/20
[52] U.S. Cl. .................. 361/704; 248/316.7; 257/726; 267/160; 361/707
[58] Field of Search ................... 24/455, 457, 458, 24/570, 625; 411/511, 512, 522; 248/316.7, 510; 267/150, 158, 160; 174/16.3; 165/80.3, 185; 257/718, 719, 726, 727; 361/704, 707, 709, 712, 710, 715–719, 722, 825, 807, 809

[56] References Cited

U.S. PATENT DOCUMENTS

| | | |
|---|---|---|
| 4,674,005 | 6/1987 | Lacz ........................ 361/388 |
| 4,693,698 | 9/1987 | Olson, II . |
| 4,899,255 | 2/1990 | Case et al. . |
| 4,964,198 | 10/1990 | McCarthy . |
| 5,122,480 | 6/1992 | Galich et al. . |
| 5,170,325 | 12/1992 | Bentz ........................ 361/388 |
| 5,225,965 | 7/1993 | Bailey ....................... 361/386 |
| 5,274,193 | 12/1993 | Bailey ....................... 174/16.3 |
| 5,327,324 | 7/1994 | Roth . |
| 5,344,113 | 9/1994 | Jurek ........................ 248/316.7 |
| 5,436,798 | 7/1995 | Wieland, Jr. . |
| 5,466,970 | 11/1995 | Smithers . |

FOREIGN PATENT DOCUMENTS

0591947A2   4/1994   European Pat. Off. .

Primary Examiner—Gerald P. Tolin
Attorney, Agent, or Firm—Peter Abolins

[57] ABSTRACT

A spring clip assembly having integral backbone with a plurality of the spring clip members extending from the backbone, each spring clip member having a tapered loop. The loop tapers to an inwardly facing end. If desired, a special insertion tool can be used to provide for a zero insertion force assembly.

1 Claim, 3 Drawing Sheets

SPRING CLIP FOR ELECTRONICS ASSEMBLY

BACKGROUND OF THE INVENTION

1. Field of the Invention

This invention relates to a spring clip for pressing electrical components onto a heat sink of an electronics module.

2. Prior Art

The assembly of an electronics module involves mounting various electrical components to a printed circuit board. Electrical components, such as transistors, generate significant amounts of heat requiring special provisions to dissipate the generated heat. The electrical component should be in thermally conductive contact with a heat sink to obtain maximum heat transfer from the electrical component to the heat sink. This conductive heat transfer is often directly proportional to the contact pressure between the component and the heat sink, up to a particular maximum for the materials used.

It is known to have a spring clip for urging an electrical component into a heat conductor relationship with a heat sink. For example, spring clips are retained in position by clamping over the top of the heat sink. This configuration prevents the use of a heat sink as an outside wall of a sealed electronics module. Also, as discussed in U.S. Pat. No. 5,327,324 it is known to provide a spring clip for urging an electrical component against a heat sink which also serves as an exterior housing for a sealed electronics module. If no insertion tool is used connection with the configuration shown in the U.S. Pat. No. '324 patent, a spring clip finger scrapes on the transistor housing during insertion. This exposes the transistor housing to damage.

Thus, various spring clips are known which essentially have the features of having two surfaces which are forced toward each other by a resilient flexible connecting member. Disadvantages associated with prior art spring clips include the need for special tools to attach the clip, the movement or slipping of the clip thereby reducing the clips fastening ability, and the inability of the clip to provide sufficient clamping force to adequately couple the components being connected. These are some of the drawbacks that this invention overcomes.

SUMMARY OF THE INVENTION

A spring clip in accordance with an embodiment of this invention allows for the attachment of a plurality of semiconductor packages to a heat sink with a single clip. Furthermore, a clip in accordance with this invention does not require any special tools for attachment. That is, no tool is necessary if the semiconductor package can tolerate an insertion force during application of the clip which is similar to the force applied to the semiconductor package once the clip is in place. If there is a need for zero force during insertion, a tool can be used to maintain deflection of the clip during insertion. It can be attached to the face of a heat sink, therefore it does not need a rail shaped heat sink. Advantageously, the clip is contoured to follow the shape of the semiconductor package device to give the clip the smallest possible assembled profile and give the highest spring force and spring displacement while minimizing the stresses in the spring member itself.

The clip is versatile such that a screw on either end of the clip can hold it in place. Alternatively, the clip can be slid into slots formed in the heat sink to hold the clip in place. In particular, a power electronic device, such as a T0220 can be secured by a spring clip instead of through the use of individual screws or individual clips associated with each of such power electronic device. That is, the spring clip can secure a plurality of power electronic devices with a screw being used at each end of the spring clip. This reduces the number of parts in the assembly. Further, the power device can be more easily electrically isolated from the heat sink with the use of a spring clip since the clip can exert its clamping force on the electrically insulating body of the power device and does not contact any electrically conductive portion of the power device.

DETAILED DESCRIPTION OF THE INVENTION

Figure 1:
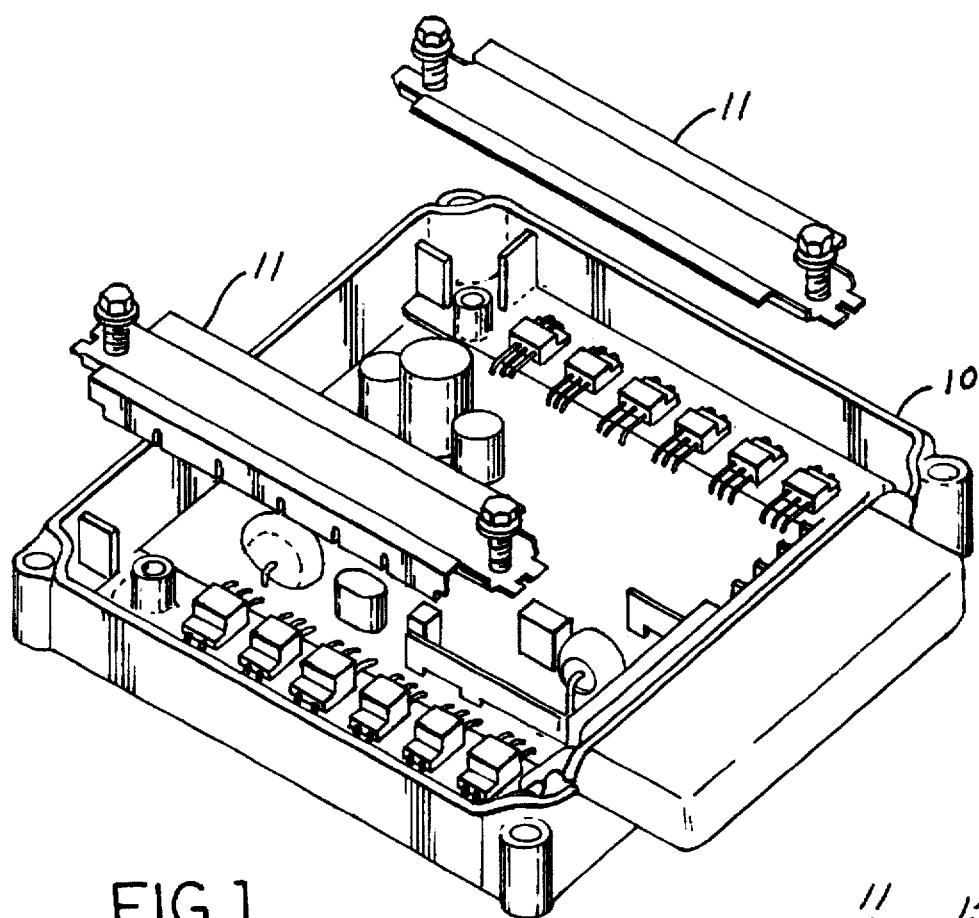
FIG. 1 is a perspective view of an electronic circuit assembly including a spring clip in accordance with an embodiment of this invention.

When building electronic modules with high power electronic components, it is often necessary to sink the excess heat that is a byproduct of the operation of these devices. This is often accomplished by clamping the power electronic device to a metal housing or rail known as a heat sink. This invention includes a spring clip configuration which is intended to secure power electronic devices.

An ideal spring member achieves three goals. The first is the spring member is capable of exerting continuously a certain minimum force on the power electronic devices. This insures that intimate contact is maintained between the electronic device and the heat sink, and minimizes the resistance of heat flow from the power devise to the heat sink. If an electrical insulator is used between the power device and the sink, the minimum required clamping force is typically considered to be approximately 70 Newtons. The second goal is the spring member having a sufficiently low spring constant that all assembly and component dimensional tolerances can be taken up by the spring member without the force exerted by the spring member on the power device falling below the minimum required clamping force or varying significantly from one assembly to the next. The third goal is for the spring member to be compact in size.

The design a spring member in accordance with this invention has a number of advantageous features. First, the spring members can be ganged together to form a single spring clip with multiple spring members, utilizing a separate backbone to stiffen the clip across its multiple member length, or it can utilize an integrally formed backbone which is designed to be appropriately stiff to minimize the amount of flex of the backbone, such that the central spring members are able to exert the required minimum amount of force. Second, the spring members can be spaced as closely together as the electronic power devices will allow since the spring members are no wider than the electronic packages themselves. Third, the spring members are designed to follow the contours of the electronic packages which they are clamping to minimize the volume of the spring member. This along with the large radius main loop of the spring member allows the member to develop high forces (95–110 Newtons) over a relatively long travel (3.0 mm), and consequently a relatively low spring rate 31–37 Newtons/mm) without plastic deformation of the member occurring. These are unusual characteristics for clip as compact as this design. This allows for very consistent, and very high forces to be applied to the electronic packages across the length of the clip and from clip to clip, even with dimensional tolerances of the clip, and large dimensional tolerances of electronic packages from various semiconductor manufacturers. Fourth, the spring member can be configured to include a hook on its tip such that the spring member can be proloaded with a tool and the spring clip can be assembled into the electronic module without exerting force on the module or electronic packages. Once the tool is removed, the spring members exert the full design force on the electronic packages. Fifth, the spring clip does not require a rail shaped heat sink to provide clamping force. This makes this spring clip more suitable for electronic modules that need to be sealed since a portion of the spring clip does not need to be placed over an outside wall of the module case. Instead, the clip attaches to any internal or external face of the module case, and can be secured in place with the use of a screw at either end, or slots can be placed in the heat sink to allow the clip to be hooked in place without the use of additional fasteners.

Figure 2:
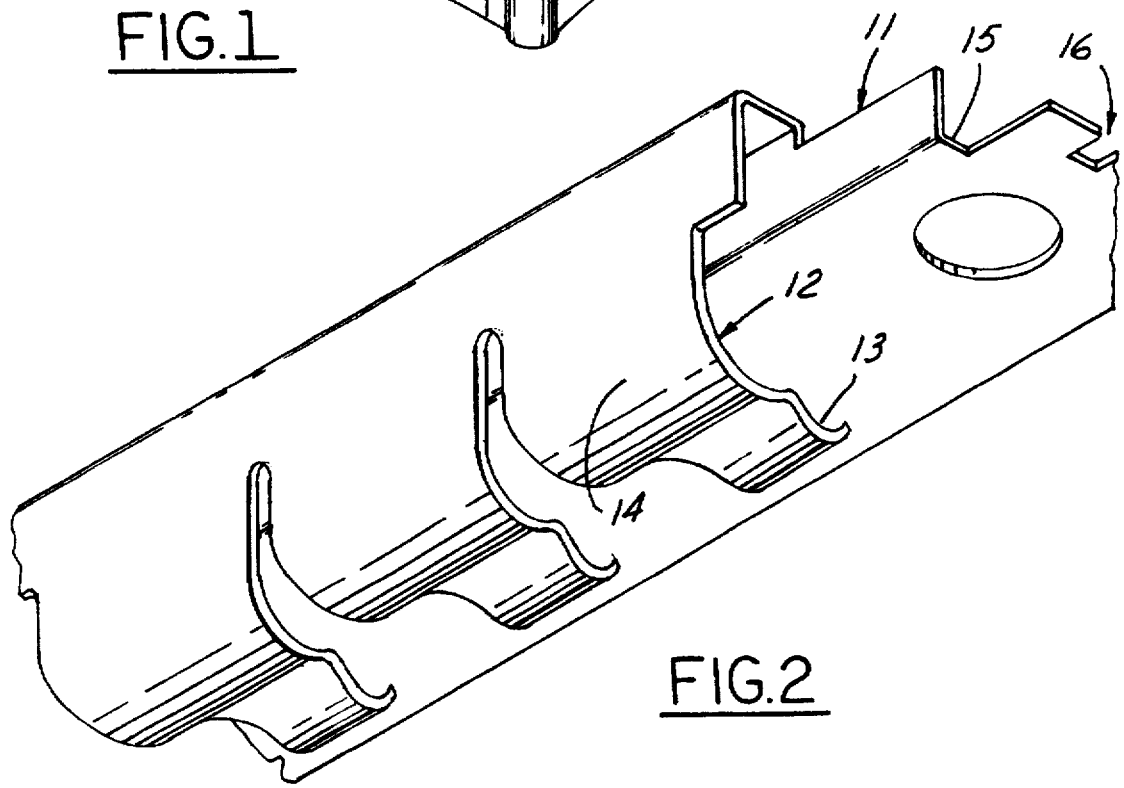
FIG. 2 is a perspective view of a portion of a spring clip in accordance with an embodiment of this invention.
Figure 3:
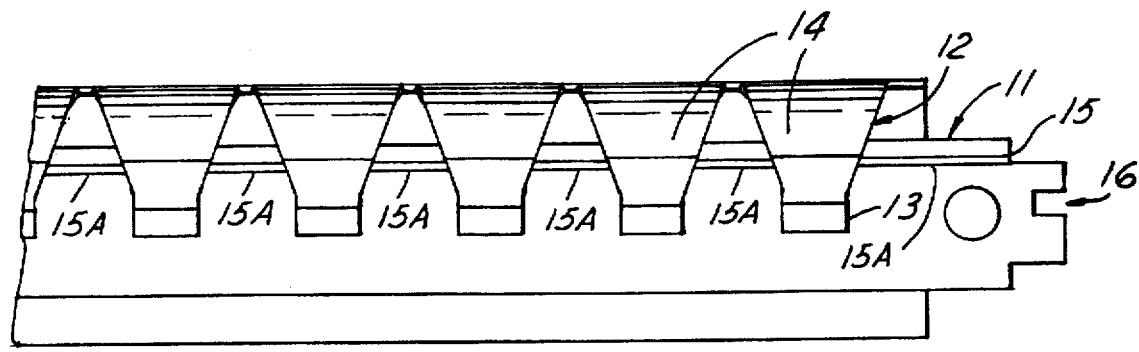
FIG. 3 is a side view of a spring clip in accordance with an embodiment of this invention.
Figure 4:
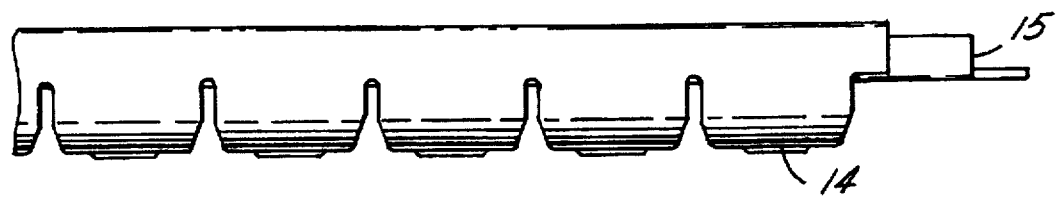
FIG. 4 is a top view of a spring clip in accordance with an embodiment of this invention.
Figure 5:
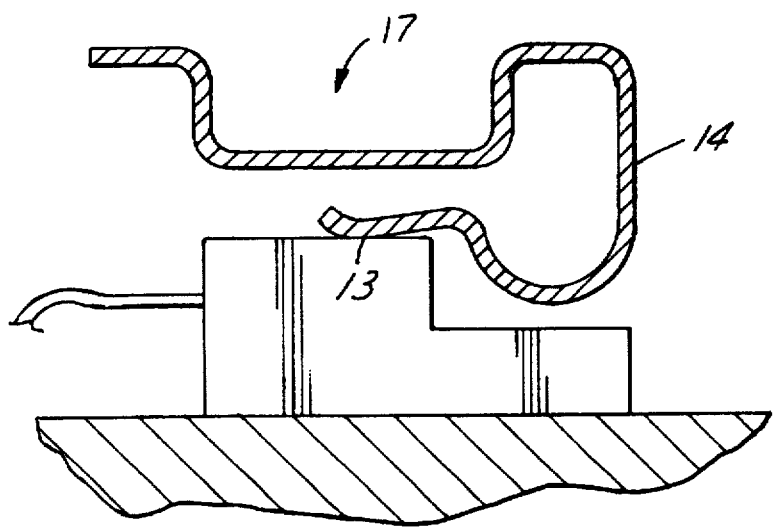
FIG. 5 is a cross-sectional end view of a spring clip coupled to an electronic assembly in accordance with an embodiment of this invention.

Referring to FIG. 1, an electronic module 10 is positioned to receive a spring clip assembly 11. Referring to FIG. 2, spring clip assembly 11 includes a backbone 15 which is coupled to a plurality of spring members 12 and includes a longitudinal reinforcement groove 17. Each of spring members 12 has a tapered front portion 13 and a curved portion 14. If desired, backbone 15 can be reinforced by a separate backbone reinforcement member 15a so that spring clip assembly 11 can be lengthened. Spring members 12 have a shape that can follow the power device contour for a minimum clip volume as shown in FIG. 5. The spring members have a tapered shape and a large loop which minimizes and evenly distributes the stresses in each spring member during application. This clip can be applied to a heat sink surface making it suitable for use in sealed on closures that use the enclosure walls for heat sinking. Advantageously, the shape of clip assembly 11 allows for lower cost multi slide forming of the clip as opposed to requiring the use of an expensive progressive die for forming. Backbone 15 prevents over compression and permanent distortion of spring members 12 during application. Spring members 12 clamp on the body of the electronic power device simplifying electrical isolation of the clip. Inward forming of the spring members minimizes tangling of the clips during shipment. The shape of integral backbone 15 maximizes the stiffness of the backbone while minimizing the mass of the clip and clip profile. The integral backbone channel completely contains the fastening screw, thus reducing total clip profile.

A low spring rate is desirable because it allows the spring member to absorb cumulative dimensional tolerances of the spring member and the semiconductor device to be contacted while maintaining a relatively consistent application force from one electronic module assembly to another such assembly which utilizes those clips. This makes manufacturing more consistent, module to module and spring clip to spring clip. Using a plurality of such spring members is advantageous because they can compensate for dimensional variations such as semiconductors having differing heights. The combination of a large radius of curvature and tapered spring allows for a low spring rate. Units are pounds per inch (or Newtons per millimeter) of deflection. Using both a taper and curvature allows the spring to be compact and use the smallest space.

The shape of spring clip assembly 11 is such that spring travel is limited to a point before plastic deformation occurs. More particularly, travel from portion 13 toward backbone 15 is sufficiently limited in distance that plastic deformation of curved portion 14 does not take place.

The spring member can have an alignment indentation 16 for assisting in aligning the spring member during assembly and providing a latching means. The indentation is at each end of the spring means and is off center so the spring means cannot be inserted facing the incorrect way.

Figure 6:
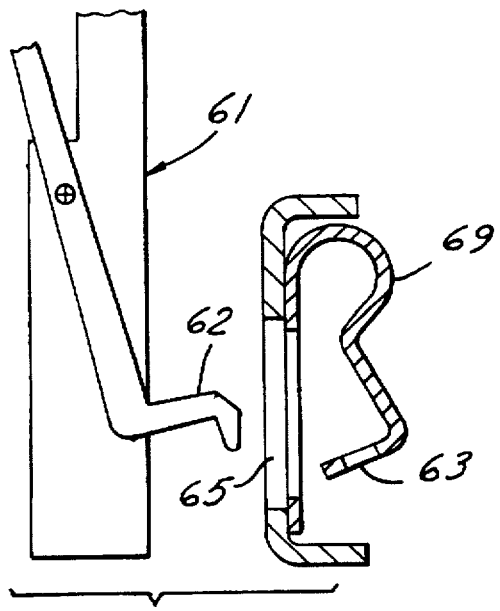
FIG. 6 is a cross-sectional view of a spring clip and an associated assembly tool, with the spring clip in a free position.
Figure 7:
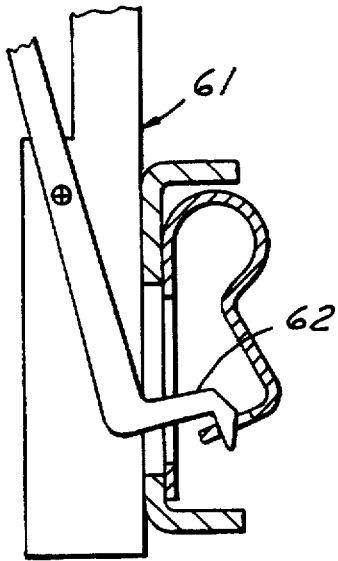
FIG. 7 is a cross-sectional view similar to FIG. 6 with the spring clip loaded into the application tool.
Figure 8:
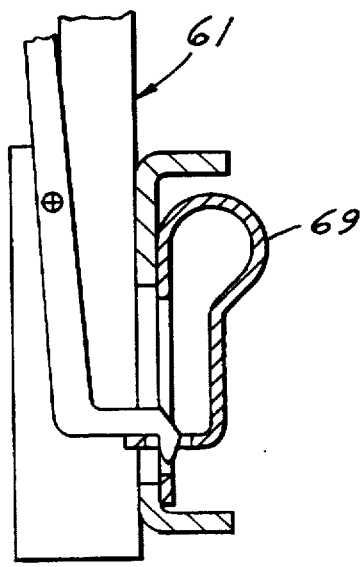
FIG. 8 is a cross-sectional view similar to FIG. 7 with the application tool compressing the spring clip.
Figure 9:
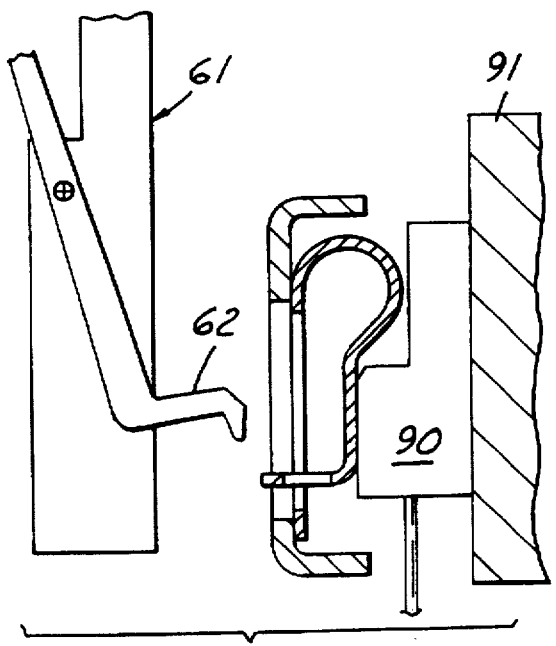
FIG. 9 is a cross-sectional view similar to FIG. 8 with the addition of a heat sink and semiconductor member to be coupled between the heat sink and the spring clip, the spring clip being shown in a position fastened to the heat sink and the application tool being released and removed.

A tab (such as tab 13 in FIG. 2 or tab 63 in FIG. 6) may also have an opening which can pass a retaining hook for deflecting the tab during assembly. With the tab deflected no force is applied during assembly. The backbone of the spring member may also have an opening for passing the retaining hook so it can access the opening in the tab.

More specifically, referring to FIGS. 6 through 9, an assembly tool 61 has a pivoting arm 62 which can engage an opening in tab 63 in a curved portion of a spring clip 69 through an opening 65 in the backbone portion of spring clip 69. Spring clip 69 is loaded onto application tool 61 so that arm 62 is pivoted and compresses spring clip 69. Thus spring clip 69 can be positioned against a semiconductor circuit 90 mounted on a heat sink 91 without applying any force on semiconductor circuit 90. After spring clip 69 is fastened to heat sink 91, application tool 61 is released and removed.

Various modifications and variations will no doubt occur to those skilled in the arts to which this invention pertains. Such variations which basically rely on the teachings through which this disclosure is advanced in the art are properly considered within the scope of this invention.

What is claimed:

1. An electronic module having an electrical component, said module comprising:

a heat sink including a planar surface;

a heat sink housing for supporting said heat sink;

a spring clip including an elongated planar body having a longitudinal axis extending from a right end to a left end, an intermediate portion therebetween, and an inner edge and an outer edge parallel to said longitudinal axis;

said planar body including a reinforcement groove traversing from said right end to said left end substantially parallel to said longitudinal axis of said planar body, said reinforcement groove being adapted to increase the torsional and bending rigidity of said elongated planar body to reduce the variability of contact pressure among multiple electrical components;

said spring clip having a plurality of spring members for applying a force to a plurality of semiconductor members to be attached to a heat sink;

said clip further having an integral backbone coupled to said plurality of spring members for providing structural rigidity;

said spring members each having a looped portion having a tapered end facing inward toward said backbone so that each spring member has substantially a constant applied stress along its length and produces a cross section of advantageously small area;

said backbone having a shape and a position in relation to said spring members for preventing overcompression and permanent deformation of the spring members during application;

said clip further comprising an additional discrete backbone reinforcement member coupled to said integral backbone;

said clip further having said spring members wherein at least one of said plurality of spring members has an opening for receiving a deflection tool to deflect the spring member, wherein said opening is located outside of the flexing portion of said spring member;

said backbone member having an opening for passing the deflection tool so said opening in said spring member can be engaged;

said clip further comprising retention means for securing said clip to said heat sink, said retention means extending downward from each of said ends of said body;

said retention means further including contact means to operatively compressive and engage said planar surface to secure said clip in said heat sink housing, said contact means having a curvature to reduce the stress level therein; and said retention means further including urging means for contacting and urging said electrical component into a heat conducting relationship with said heat sink housing, said urging means includes a first elongated member depending downward from said inner edge of said body to a first end.

\* \* \* \* \*